United States Patent [19]

Zimmer

[11] Patent Number: 5,131,140
[45] Date of Patent: Jul. 21, 1992

[54] METHOD FOR EVALUATING PLANE SPLITS IN PRINTED CIRCUIT BOARDS

[75] Inventor: Paul R. Zimmer, Citrus Heights, Calif.

[73] Assignee: Hewlett-Packard Company, Palo Alto, Calif.

[21] Appl. No.: 661,040

[22] Filed: Feb. 26, 1991

[51] Int. Cl.⁵ .................. H05K 3/02; H05K 1/00
[52] U.S. Cl. ........................... 29/846; 29/832; 174/261; 361/408; 361/409; 439/79
[58] Field of Search ............. 29/832, 846, 840; 361/409, 408; 439/79; 174/261

[56] References Cited

U.S. PATENT DOCUMENTS

| | | | |
|---|---|---|---|
| 3,530,231 | 9/1970 | Penoyer | 361/409 X |
| 4,255,613 | 3/1981 | Ketchpel | 174/261 X |
| 4,938,701 | 7/1990 | Heberling | 439/79 X |
| 5,031,073 | 7/1991 | Chang | 29/832 X |

FOREIGN PATENT DOCUMENTS 932791  7/1963  United Kingdom ........... 174/261

OTHER PUBLICATIONS

IBM Tech Disclosure Bull, vol. 9, No. 1, Jun. 1966, pp. 18–19 by K. H. Raacke.
IBM Tech Disclosure Bull, vol. 9, No. 2, Jul. 1966, pp. 152–154 by J. F. Smith.

Primary Examiner—Carl J. Arbes

[57] ABSTRACT

In method for electrically connecting sections of a split plane in a printed circuit board, conductive strips are placed on a surface plane of the printed circuit board, along borders of the sections of the split plane. The conductive strips are connected to the sections of the split plane through vias. For every first section and second section which are to be electrically connected, a single piece of conductive material is connected to a conductive strip placed on a border of the first section and is connected to a conductive strip placed on a border of the second section. Testing may then be performed to determine electromagnetic properties of the printed circuit board for different combinations of the sections being connected together. From the results of the testing the optimal borders for the split plane can be determined.

15 Claims, 5 Drawing Sheets

METHOD FOR EVALUATING PLANE SPLITS IN PRINTED CIRCUIT BOARDS

BACKGROUND

The present invention concerns the determination of the location of splits in the ground plane and power plane of a printed circuit board in order to minimize radio frequency noise and to minimize the potential of electrostatic discharge to damage components on the printed circuit board.

When designing a printed circuit (PC) board for electromagnetic compatibility, it is often difficult to predict how the ground plane and/or the power plane should be split in order to minimize radio frequency noise and to minimize the potential of electrostatic discharge to damage components on the printed circuit board. This problem is particularly acute in the design of interface cards such as those used to interface a computer system to a local area network (LAN) where, often, an LAN input/output (I/O) driver is placed on the same integrated circuit (IC) as an LAN clock source. In such cases the locations for plane splits are usually determined by experimentation.

In the prior art, experimental results are obtained, for example, by generating multiple versions of the PC board, each with a different splitting of the plane. This, however, tends to be very costly.

SUMMARY OF THE INVENTION

In accordance with the preferred embodiment of the present invention, a method is presented for electrically connecting sections of a split plane in a printed circuit board. First, on a surface plane of the printed circuit board, conductive strips are placed along borders of the sections of the split plane. These conductive strips are, for example, exposed copper strips. The conductive strips are connected to the sections of the split plane through vias. For every first section and second section which are to be electrically connected, a single piece of conductive material is connected to a conductive strip placed on a border of the first section and is connected to a conductive strip placed on a border of the second section. The conductive material is, for example, conductive tape. Testing may then be performed to determine electromagnetic properties of the printed circuit board for different combinations of the sections being connected together. From the results of the testing the optimal borders for the split plane can be determined.

DESCRIPTION OF THE PREFERRED EMBODIMENT

Figure 1:
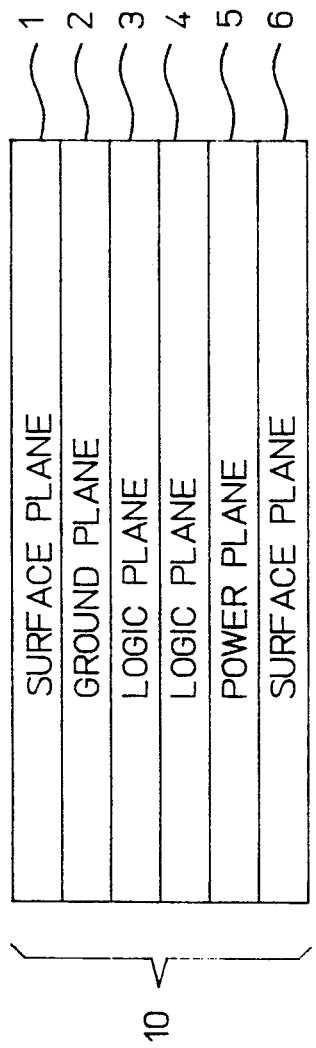
FIG. 1 shows a cross-sectional view of a printed circuit board.

FIG. 1 shows a cross-sectional view of planes of a printed circuit board. Logical components are placed on a surface plane 1 and a surface plane 6. A reference voltage is placed on a ground plane 2. A power signal is placed on a power plane 5. Wire traces are placed on a logic plane 3 and a logic plane 4. Components and traces on the surface planes are connected to other planes through vias. Vias are holes in the printed circuit board which have been metal plated. For planes that are to be electrically connected to the vias, conductors with thermal reliefs are placed on the plane which contact the metal plating in the vias. For a plane that is not to be electrically connected to a via, insulation is placed around the via, electrically isolating the plane from the via.

Typically, in the design of a printed circuit board, ground plane 2 and power plane 5 are each made from a single sheet of copper. However, using a single sheet for each of these planes may result in an unacceptable level of radio frequency noise and/or too great a susceptibility for components on the printed circuit board to be damaged as a result of electrostatic discharge. Therefore, often the ground plane and/or the power plane are split so that sections of the split plane are electrically isolated from other sections of the split plane.

For example, a printed circuit board may be fabricated with the ground plane and/or the power plane each being a single sheet of copper. After electro-magnetic compatibility testing, if it is determined one or both of the planes should be split, the ground plane and/or power plane may then be cut into sections. The electro-magnetic compatibility may then be tested with the split planes. It is often impractical, however, to split the plane without rendering the PC board unusable.

Figure 2:
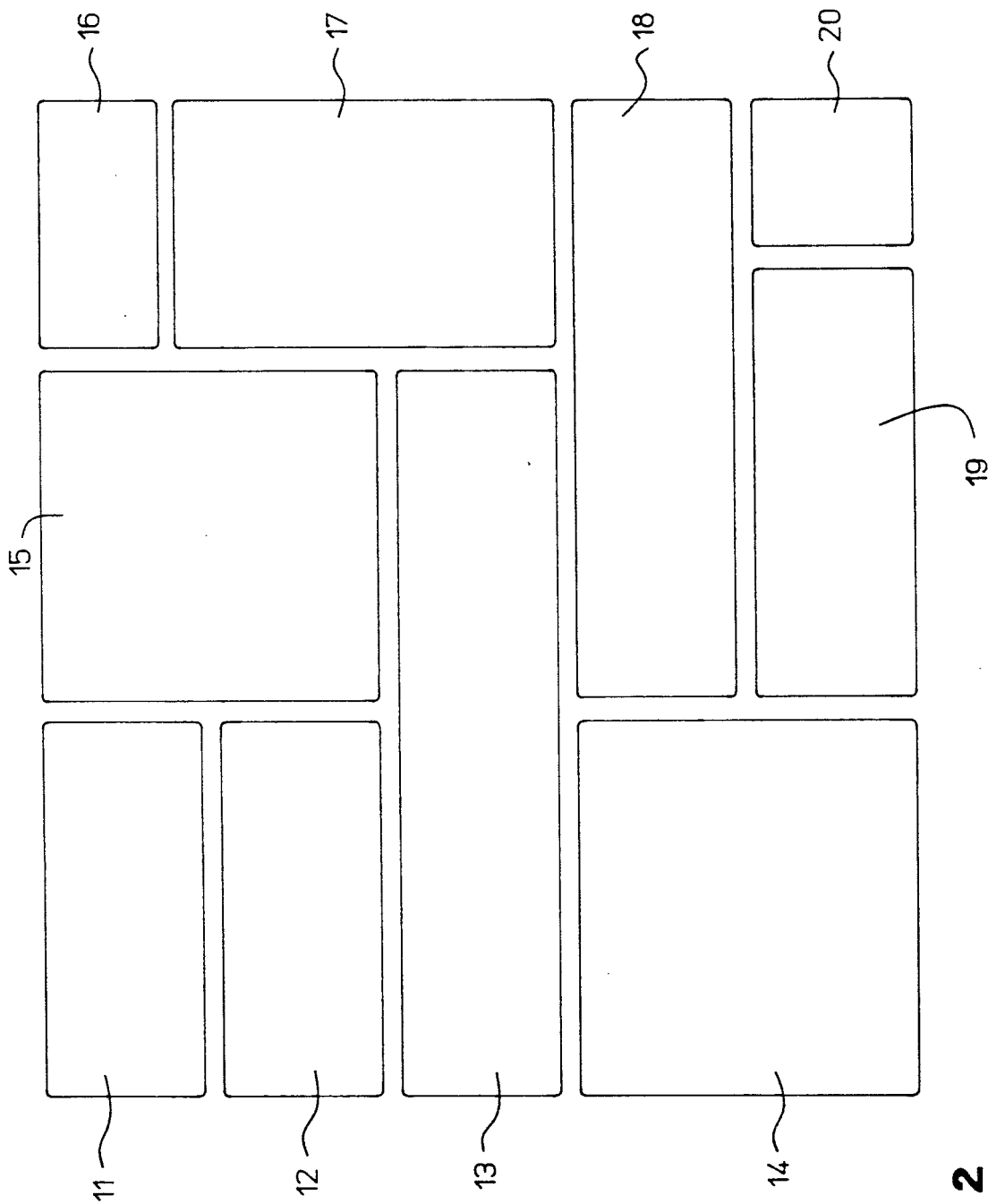
FIG. 2 shows a split plane of a printed circuit board sectioned in accordance with the preferred embodiment of the present invention.

Alternately, the ground and/or power plane may be split during production of the printed circuit board. For example, FIG. 2 shows a plane split into a section 11, a section 12, a section 13, a section 14, a section 15, a section 16, a section 17, a section 18, a section 19 and a section 20. During testing, various of these sections may be connected together using jumpers made from copper wires. The jumpers, however, can introduce inductance between the sections which can skew the experimental data.

Figure 3:
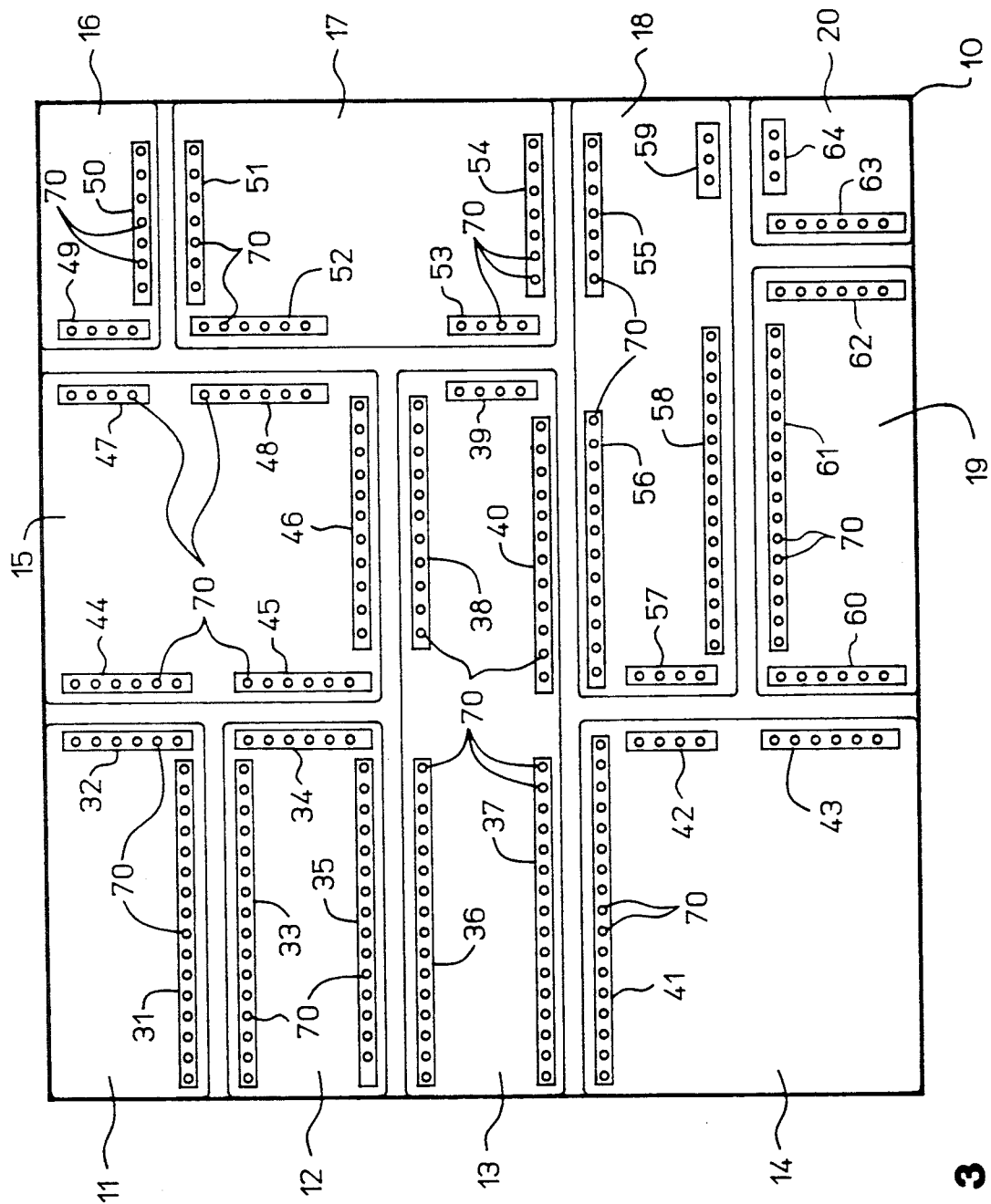
FIG. 3 shows the surface of the printed circuit board with copper strips running along borders of the split plane shown in FIG. 2 in accordance with the preferred embodiment of the present invention.
Figure 4:
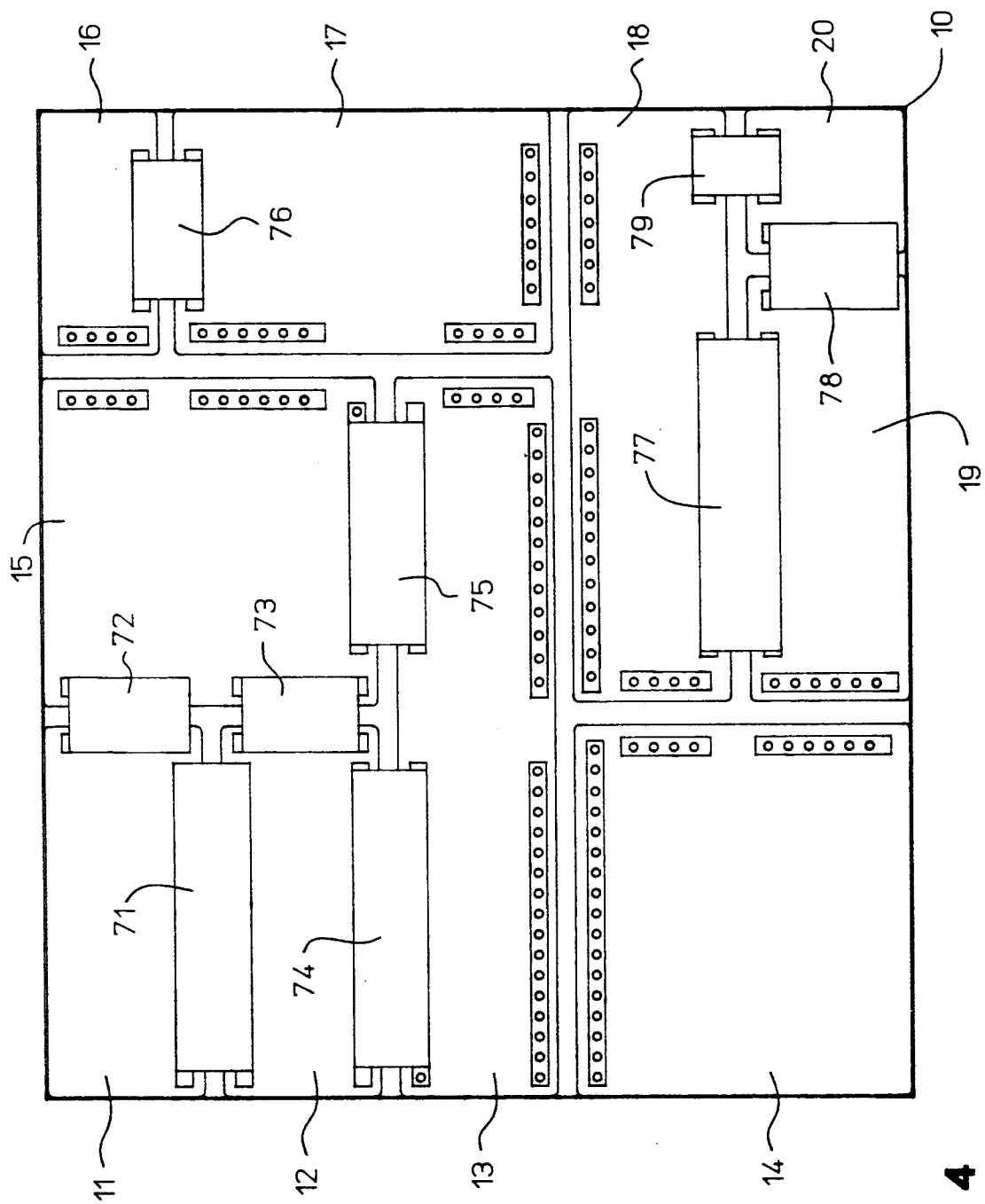
FIG. 4 and FIG. 5 show electrically conducting tape electrically connecting together certain of the copper strips on the surface of the printed circuit board shown in FIG. 3 in accordance with the preferred embodiment of the present invention.
Figure 5:
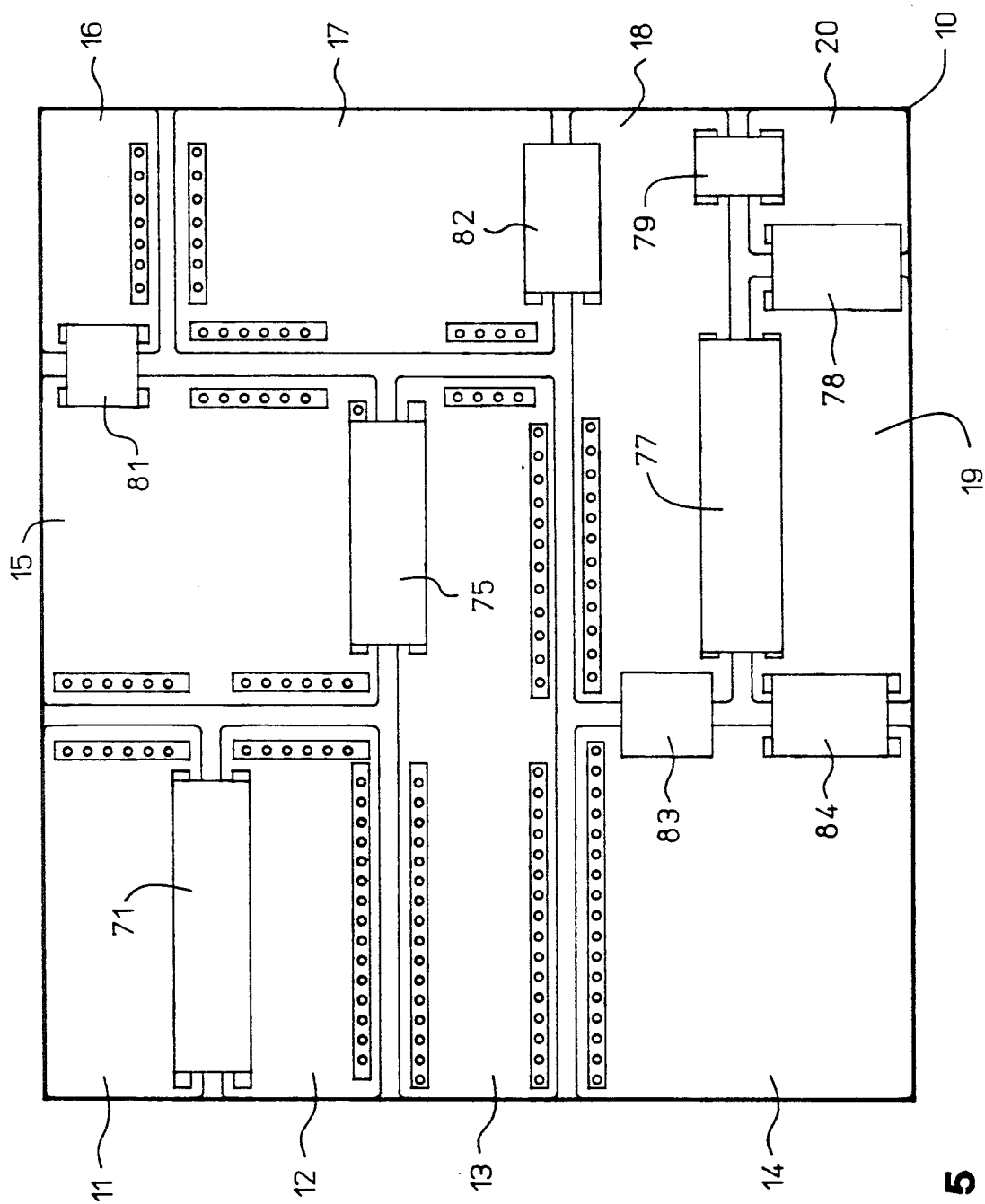

FIGS. 3 through 5 demonstrate a method of connecting sections of split planes together in accordance with the preferred embodiment of the present invention. In FIG. 3, on a surface plane of the printed circuit board, conductive strips have been placed at borders of the split plane, i.e., the split ground plane or split power plane. The conductive strips are, for example, exposed copper strips which are one-tenth of an inch wide.

As may be seen from FIG. 3 an exposed copper strip 31 and an exposed copper strip 32 have been placed on the surface plane of the printed circuit board along borders of section 11 of the split plane. An exposed copper strip 33, an exposed copper strip 34 and an exposed copper strip 35 have been placed on the surface plane of the printed circuit board along borders of section 12 of the split plane. An exposed copper strip 36, an exposed copper strip 37, an exposed copper strip 38, an exposed copper strip 39 and an exposed copper strip 40 have been placed on the surface plane of the printed circuit board along borders of section 13 of the split plane.

An exposed copper strip 41, an exposed copper strip 42, and an exposed copper strip 43 have been placed on the surface plane of the printed circuit board along borders of section 14 of the split plane. An exposed copper strip 44, an exposed copper strip 45, an exposed copper strip 46, an exposed copper strip 47, and an exposed copper strip 48 have been placed on the surface plane of the printed circuit board along borders of section 15 of the split plane. An exposed copper strip 49 and an exposed copper strip 50 have been placed on the surface plane of the printed circuit board along borders of section 16 of the split plane. An exposed copper strip 51, an exposed copper strip 52, an exposed copper strip 53 and an exposed copper strip 54 have been placed on the surface plane of the printed circuit board along borders of section 17 of the split plane.

An exposed copper strip 55, an exposed copper strip 56, an exposed copper strip 57, an exposed copper strip 58 and an exposed copper strip 59 have been placed on the surface plane of the printed circuit board along borders of section 18 of the split plane. An exposed copper strip 60, an exposed copper strip 61, and an exposed copper strip 62 have been placed on the surface plane of the printed circuit board along borders of section 19 of the split plane. An exposed copper strip 63 and an exposed copper strip 64 have been placed on the surface plane of the printed circuit board along borders of section 20 of the split plane.

Each of the copper strips are electrically connected to the split plane through vias 70. In order to minimize inductance, the vias 70 are placed relatively close together. For example, in the preferred embodiment, the vias are spaced 0.15 inches apart.

Once the board has been fabricated as shown in FIG. 3, the exposed copper strips may be electrically connected using electrically conductive material. For example, foil shielding tape may be used such as is available from the Electrical Specialties Division of 3M, having a business address of P.O. Box 2963, Austin, Texas 78769-2963. Such electrically conductive tape may be attached using a conductive adhesive and/or soldering. Using the conductive tape to electrically connect together two or more sections very closely approximates the electrical properties of the printed circuit board when the sections are actually joined as a single layer of conductive material.

In FIG. 4, for example, section 11 is connected to section 12 by a tape strip 71. Section 11 is connected to section 15 by a tape strip 72. Section 12 is connected to section 15 by a tape strip 73. Section 12 is connected to section 13 by a tape strip 74. Section 13 is connected to section 15 by a tape strip 75. Section 16 is connected to section 17 by a tape strip 76. Section 18 is connected to section 19 by a tape strip 77. Section 18 is connected to section 20 by a tape strip 79. Section 19 is connected to section 20 by a tape strip 79.

The printed circuit board shown in FIG. 4 will have electromagnetic properties essentially equal to that of a board having a plane split into four portions. The first portion is the combination of sections 11, 12, 13 and 15. The second portion is section 14. The third portion is the combination of sections 16 and 17. The fourth portion is the combination of sections 18, 19 and 20.

Electromagnetic properties for different combinations of sections may be tested simply by moving tape sections. For example, in FIG. 5, tape strips 72, 73, 74 and 76 have been removed. However, section 15 has been connected to section 16 by a tape strip 81. Section 17 has been connected to section 18 by a tape strip 82. Section 14 has been connected to section 18 by a tape strip 83. Section 14 has been connected to section 19 by a tape strip 84.

The printed circuit board shown in FIG. 5 will have electromagnetic properties essentially equal to that of a board having a plane split into three portions which are different than the four portions from FIG. 4. In FIG. 5, the first portion is the combination of sections 11 and 12. The second portion is a combination of sections 13, 15 and 16. The third portion is a combination of sections 14, 17, 18, 19 and 20.

Once testing has determined the grouping of sections, the printed circuit boards may be manufactured with a split plane which is split according to the groupings determined in the testing.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

I claim:

1. A method comprising the steps of:
   (a) constructing a printed circuit board which has a surface plane and a split plane, the split plane having a plurality of sections, and the surface plane extending over all the sections in the plurality of sections;
   (b) on the surface plane of the printed circuit board, placing conductive strips along borders of the sections of the split plane;
   (c) connecting the conductive strips to the sections of the split plane through vias; and,
   (d) for every first section and second section which are to be electrically connected, electrically connecting a single piece of conductive material to a conductive strip placed on a border of the first section and connecting the single piece of conductive material to a conductive strip placed on a border of the second section.

2. A method as in claim 1 wherein the conductive strips are exposed copper strips.

3. A method as in claim 1 wherein the conductive material is electrically conductive tape.

4. A method as in claim 3 wherein in step (d) the single piece of conductive material is attached using a conductive adhesive.

5. A method as in claim 1 wherein in step (d) the single piece of conductive material is attached using a conductive adhesive.

6. A method for determining optimal borders for a split plane in a printed circuit board, the method comprising the steps of:
   (a) manufacturing a first printed circuit board with a first split plane having a plurality of sections;
   (b) on a surface plane of the first printed circuit board, placing conductive strips along borders of the sections of the first split plane;
   (c) connecting the conductive strips to the sections of the first split plane through vias;
   (d) electrically connecting different combinations of sections together using conductive material to electrically connect conductive strips which are connected to different sections of the first split plane;

(e) performing electrical testing of the first printed circuit board for every combination in step (c);

(f) from results of electrical testing in step (d) determining an optimal grouping of sections of the first split plane; and, (g) manufacturing printed circuit boards with a split plane so that borders of the split plane are along the optimal grouping of sections determined in step (e).

7. A method as in claim 6 wherein the conductive strips are exposed copper strips.

8. A method as in claim 6 wherein the conductive material is electrically conductive tape.

9. A method as in claim 8 wherein in step (d) the conductive material is connected using a conductive adhesive.

10. A method as in claim 6 wherein in step (d) the conductive material is connected using a conductive adhesive.

11. A printed circuit board comprising:

a split plane, the split plane having a plurality of sections;

a surface plane, the surface plane extending over all the sections in the plurality of sections;

conductive strips placed on the surface plane, the conductive strips being along borders of the sections of the split plane;

vias from the conductive strips to the sections of the split plane which electrically connect the conductive strips to the sections of the split plane; and, pieces of conductive material each piece of conductive material being attached to two conductive strips, each of the two conductive strips being connected to different sections of the split plane.

12. A printed circuit board as in claim 11 wherein the conductive strips are exposed copper strips.

13. A printed circuit board as in claim 11 wherein the conductive material is electrically conductive tape.

14. A printed circuit board as in claim 13 wherein the pieces of conductive material are attached to conductive strips using a conductive adhesive.

15. A printed circuit board as in claim 11 wherein the pieces of conductive material are attached to conductive strips using a conductive adhesive.

* * * * *